United States Patent [19]

Nozaki et al.

[11] Patent Number: 4,546,457
[45] Date of Patent: Oct. 8, 1985

[54] SEMICONDUCTOR MEMORY DEVICE

[75] Inventors: Shigeki Nozaki, Kawasaki; Yoshihiro Takemae, Yokohama, both of Japan

[73] Assignee: Fujitsu Limited, Kawasaki, Japan

[21] Appl. No.: 439,591

[22] Filed: Nov. 5, 1982

[30] Foreign Application Priority Data

Nov. 5, 1981 [JP] Japan ................................ 56-177478

[51] Int. Cl.[4] ............................................. G11C 11/40
[52] U.S. Cl. ..................................... 365/230; 365/190
[58] Field of Search ................ 365/190, 202, 207, 230

[56] References Cited

U.S. PATENT DOCUMENTS 4,330,851  5/1982  White, Jr. .......................... 365/202

Primary Examiner—Popek Joseph A.
Attorney, Agent, or Firm—Staas & Halsey

[57] ABSTRACT

A metal-insulator semiconductor dynamic memory device comprising sense amplifiers arrayed on a semiconductor substrate and column decoders. Each of the column decode being provided for a plurality of sense amplifiers and selecting one or more sense amplifiers from the plurality of sense amplifiers, the column decoders being dispersed on both sides of the arrayed sense amplifiers. A plurality of control signal lines which, in order to select the sense amplifiers, control gate elements connected between bit lines connected to the sense amplifiers and data bus lines and which are disposed on both sides of the arrayed sense amplifiers. Conducting lines are also disposed between the sense amplifiers and deliver signals from the control signal lines, for selecting sense amplifiers to the gate elements on the opposite side of the control signal lines with regard to the arrayed sense amplifiers.

9 Claims, 4 Drawing Figures

SEMICONDUCTOR MEMORY DEVICE

BACKGROUND OF THE INVENTION (1) Field of the Invention

The present invention relates to a semiconductor memory device. More particularly, it relates to a metal-insulator semiconductor (MIS) dynamic memory device in which a plurality of sense amplifiers are selected by a single decoder circuit and the number of conducting patterns connected to the decoder circuit is decreased.

(2) Description of the Prior Art

To increase the degree of integration of a semiconductor memory device, it is necessary to effectively use the chip area of the integrated circuit of the memory device. In an attempt to do this, a recent MIS dynamic memory device adopts a system in which two sense amplifiers are selected by one decoder circuit instead of using a system in which one decoder circuit selects one sense amplifier.

However, in the MIS dynamic memory device using the system in which two sense amplifiers are selected by one decoder circuit, the number of conducting patterns connected to each decoder circuit is relatively large, and, therefore, the conducting patterns occupy large areas of a semiconductor chip so that it is difficult to increase the degree of integration of the memory device. Moreover, since each of the long conducting patterns has a relatively large electrostatic capacitance, the drive capacity of a drive circuit such as a buffer amplifier circuit must be large. Accordingly, the size of the drive circuit becomes large and the speed of selecting the sense amplifiers becomes slow.

SUMMARY OF THE INVENTION

It is an object of the present invention to decrease the number of conducting patterns connected to each decoder circuit in a semiconductor memory device.

It is another object of the present invention to increase the degree of integration of a semiconductor memory device.

It is still another object of the present invention to increase the speed of selecting sense amplifiers, thereby shortening the access time of a semiconductor memory device.

According to the present invention, there is provided a semiconductor memory device including sense amplifiers which are arrayed on a semiconductor substrate, each sense amplifier being connected to a pair of bit lines. The semiconductor memory device further includes column decoders, each column decoder being provided for a plurality of sense amplifiers and selecting one or more sense amplifiers from the plurality of sense amplifiers, the column decoders being dispersed on both sides of the arrayed sense amplifiers and a plurality of control signal lines which, in order to select the sense amplifiers, control gate elements connected between the bit lines connected to the sense amplifiers and data buses and which are disposed on both sides of the arrayed sense amplifiers. Also included are conducting lines, disposed between the sense amplifiers, which transfer signals from the control signal lines to the gate elements connected to the bit lines located on the opposite side of the control signal lines with respect to the arrayed sense amplifiers.

DESCRIPTION OF THE PREFERRED EMBODIMENTS

Figure 1:
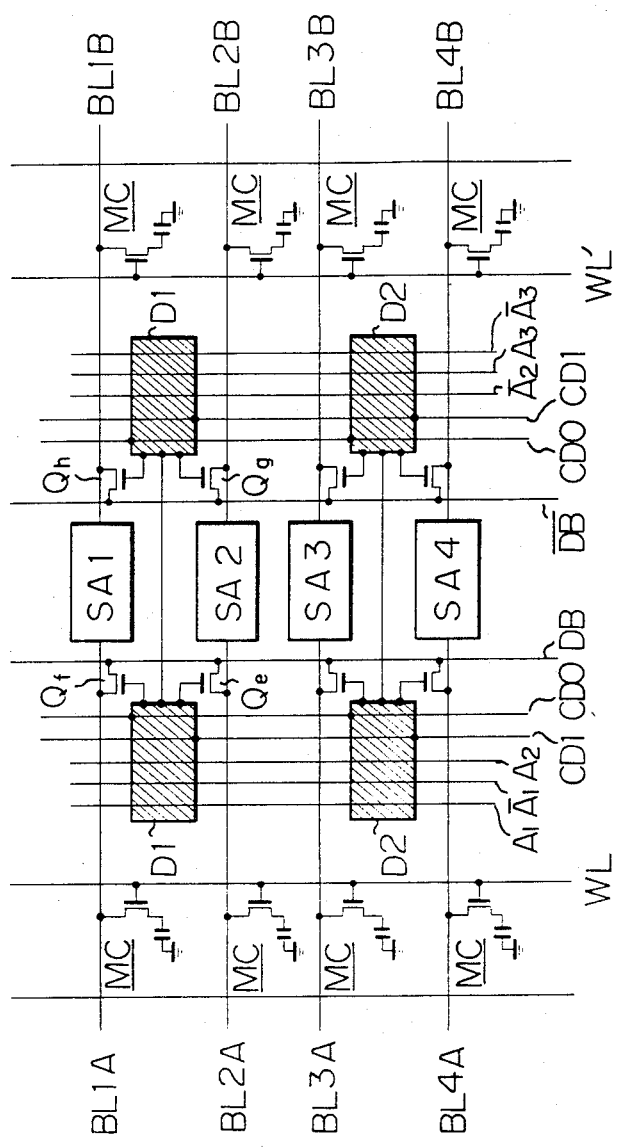
FIG. 1 is a schematic block circuit diagram of a layout of sense amplifiers and column decoders in a conventional MIS dynamic memory device.
Figure 2:
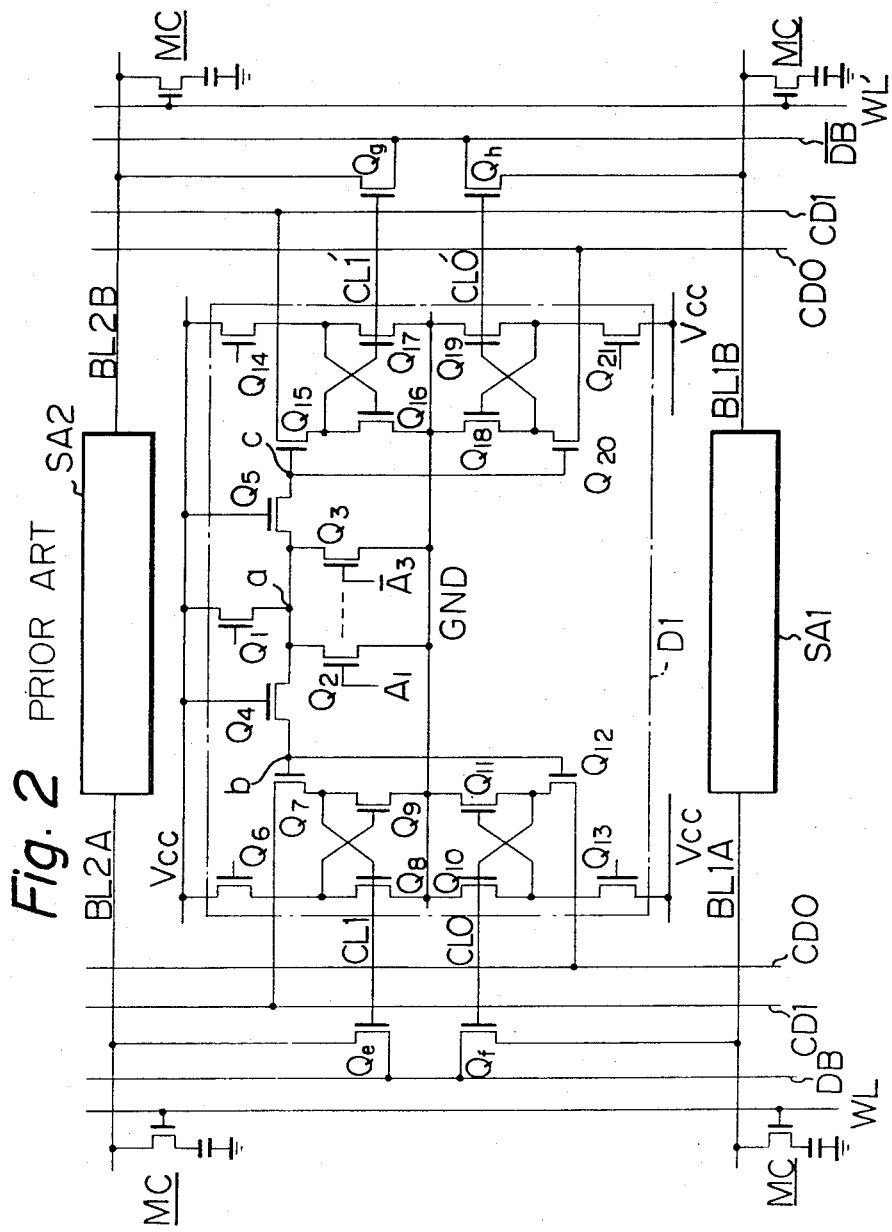
FIG. 2 is a partial block circuit diagram of a circuit for selecting a sense amplifier used in the conventional MIS dynamic memory device of FIG. 1.

FIGS. 1 and 2 are part of a conventional MIS dynamic memory device. FIG. 1 is a layout of a circuit for selecting sense amplifiers on a substrate of an integrated circuit, and FIG. 2 is a detailed circuit of the structure of FIG. 1. In these figures, the same parts are designated by the same reference symbols.

In FIG. 1, SA1 through SA4 are sense amplifiers to which bit lines BL1A and BL1B through BL4A and BL4B are connected, respectively. WL and WL' are word lines, and between each of the word lines WL and WL' and each of the bit lines BL1A, BL1B, BL2A, BL2B, - - - , BL4A, BL4B, a memory cell MC consisting of a MIS transistor and a capacitor is connected. D1 and D2 are column decoders which select one of the sense amplifiers SA1 or SA2 and one of the sense amplifiers SA3 or SA4, respectively, the column decoders D1 and D2 each comprising two separate portions, one of the portions being disposed on one side of and the other portion being disposed on the other side of the sense amplifiers SA1, SA2 and SA3, SA4, as illustrated by the hatched areas. To these decoders D1 and D2, column address lines A1, A1, A2, A2, A3, A3 and column-selecting signals CD0 and CD1 are connected. The column-selecting signals CD0 and CD1 are activated by column address signals A0 and A0, respectively, which are not shown in FIG. 1. DB and $\overline{DB}$ are data buses for transferring readout or write in data.

As illustrated in FIG. 2, the column decoder D1 comprises MIS transistors Q1 through Q21. Transistors Q1, Q2, - - - , Q3 constitute a NOR gate to which column address signals, for example, A1, - - - , A3, are applied. Transistors Q6 through Q9, Q10 through Q13, Q14 through Q17, and Q18 through Q21 constitute clamp circuits, respectively. In order to select a sense amplifier SA1 or SA2 and to transfer signals on the bit lines BL1A and BL2A and on the bit lines BL1B and BL2B to the data buses DB and $\overline{DB}$, respectively, there are provided gate elements Qe, Qf, Qg, and Qh. One of the gate elements Qe and Qf and one of the gate elements Qg and Qh are selectively turned on by output signals CL1 or CL0 and CL1' or CL0' from the column decoder D1.

In the circuit of FIG. 2, when the potential of the node a, i.e., the output of the NOR gate, is high, the transistors Q7, Q12, Q15, and Q20 are all turned on, and the column-selecting signals CD0 and CD1 are transferred to the corresponding clamp circuits and are output therefrom as the output signals CL0, CL0', CL1 and CL1'. Therefore, when the column-selecting signal CD0 is high, the gate transistors Qf and Qh are turned on, and thereby the sense amplifier SA1 is selected. When the column-selecting signal CD1 is high, the gate transistors Qe and Qg are turned on and the sense amplifier SA2 is selected.

It should be noted that in order to perform the above-mentioned operation of selecting the gate transistors Qe, Qf, Qg, and Qh, it is necessary to dispose pairs of the column-selecting lines CD0 and CD1, which are connected commonly to the column decoders D1, D2, - - -, on both sides of the column decoders D1 and D2. Therefore, as mentioned before, it is difficult to increase the degree of integration in the conventional memory device and to speed up the speed of selecting the sense amplifiers.

According to the present invention, it is possible to solve the problems of the conventional memory device. With reference to the attached drawings, an embodiment of the present invention is now explained.

Figure 3:
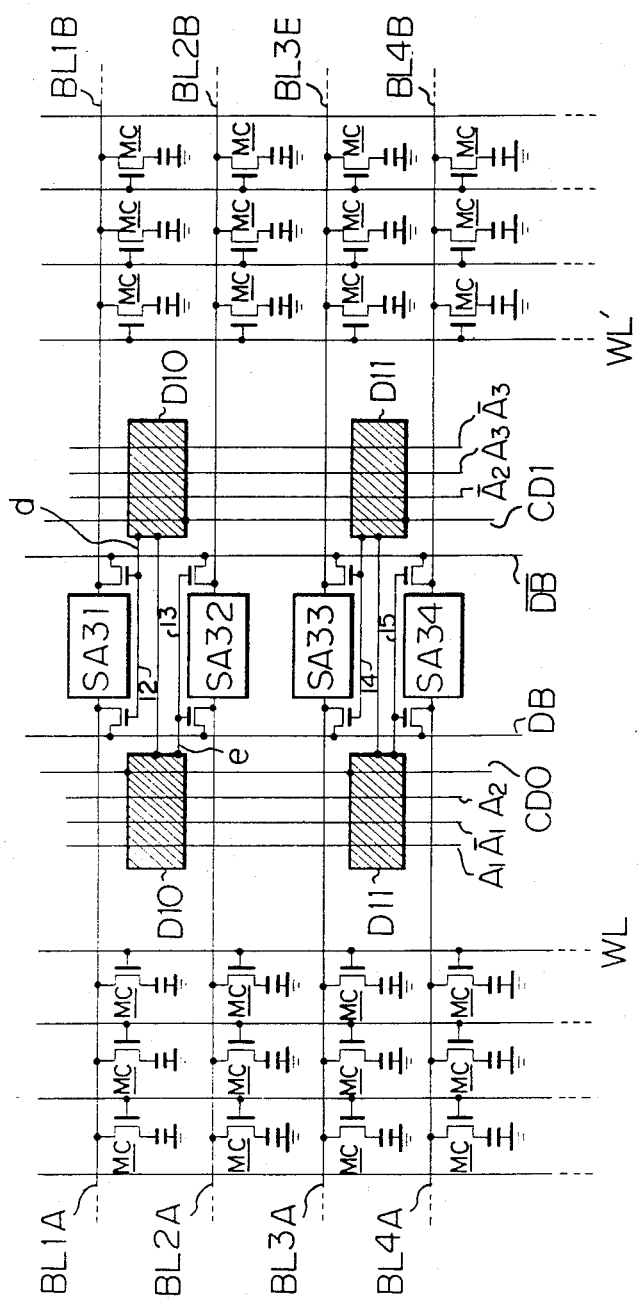
FIG. 3 is a schematic block circuit diagram of a layout of sense amplifiers and column decoders in a semiconductor memory device according to the present invention.

FIG. 3 is a schematic layout of sense amplifiers, column decoders, etc. in a MIS dynamic memory device according to the present invention. In FIG. 3, SA31, SA32, SA33, and SA34 are sense amplifiers. To both sides of the sense amplifiers SA31, SA32, SA33, and SA34, bit lines BL1A and BL1B, BL2A and BL2B, BL3A and BL3B, and BL4A and BL4B are connected, respectively. D10 and D11 are column decoders which select one of the sense amplifiers SA31 and SA32 and one of the sense amplifiers SA33 and SA34, respectively, the column decoders D10 and D11 each comprising two separate portions, one of the portions being disposed on one side of the sense amplifiers and the other portion being disposed on the other side of the sense amplifiers SA31, SA32 and SA33, SA34, as illustrated by the hatched areas. To these column decoders D10 and D11, column address lines A1, A1, A2, A2, A3, A3 and column-selecting signals CD0 and CD1 are connected. The column-selecting signals CD0 and CD1 are activated by column address signals A0 and A0, respectively, which are not shown in FIG. 3. DB and $\overline{DB}$ are data buses for transferring readout or write in data. In the description below, A0 and A0 through A3 and A3 designate both the column address lines and the column address signals.

In FIG. 3, lines 12, 13, 14, and 15 are signal lines which are disposed between the sense amplifiers and which deliver control signals for controlling transfer gates that transfer signals on the bit lines BL1A, BL2B, BL3A, and BL4B to the data buses DB and $\overline{DB}$ in the manner mentioned below. In FIG. 3, the connection between these lines 12, 13, 14, and 15 and other lines is illustrated schematically. The control signal output from an output terminal d of the right side portion of the column decoder D10 operates to transfer the signal on the bit line BL1B to the data bus $\overline{DB}$, and the control signal is delivered through the line 12 disposed between the sense amplifiers SA31 and SA32, thereby transferring the signal on the bit line BL1A to the data bus DB. The control signal output from an output terminal e of the left side portion of the column decoder D10 operates to transfer the signal on the bit line BL2A to the data bus DB, and the control signal is delivered through the line 13 disposed between the sense amplifiers SA32 and SA33, thereby transferring the signal on the bit line BL2B to the data bus $\overline{DB}$.

The lines 14 and 15 for the column decoder D11 are disposed in a manner similar to the lines 12 and 13 for the column decoder D10. Therefore, these lines 14 and 15 correspond to the lines 12 and 13, respectively, and operate in a manner similar to the lines 12 and 13 except that the sense amplifiers SA31 and SA32 are replaced by the sense amplifiers SA33 and SA34, the bit lines BL1A and BL1B are replaced by the bit lines BL3A and BL3B, and the bit lines BL2A and BL2B are replaced by the bit lines BL4A and BL4B. WL and WL' are word lines, and between each of the word lines WL and WL' and each of the bit lines BL1A, BL1B, BL2A, BL2B, - - -, BL4A, BL4B, a memory cell MC comprising a MIS transistor and a capacitor is connected. Each of the word lines WL and WL' is selected and activated by a row decoder circuit not shown in the drawing.

Figure 4:
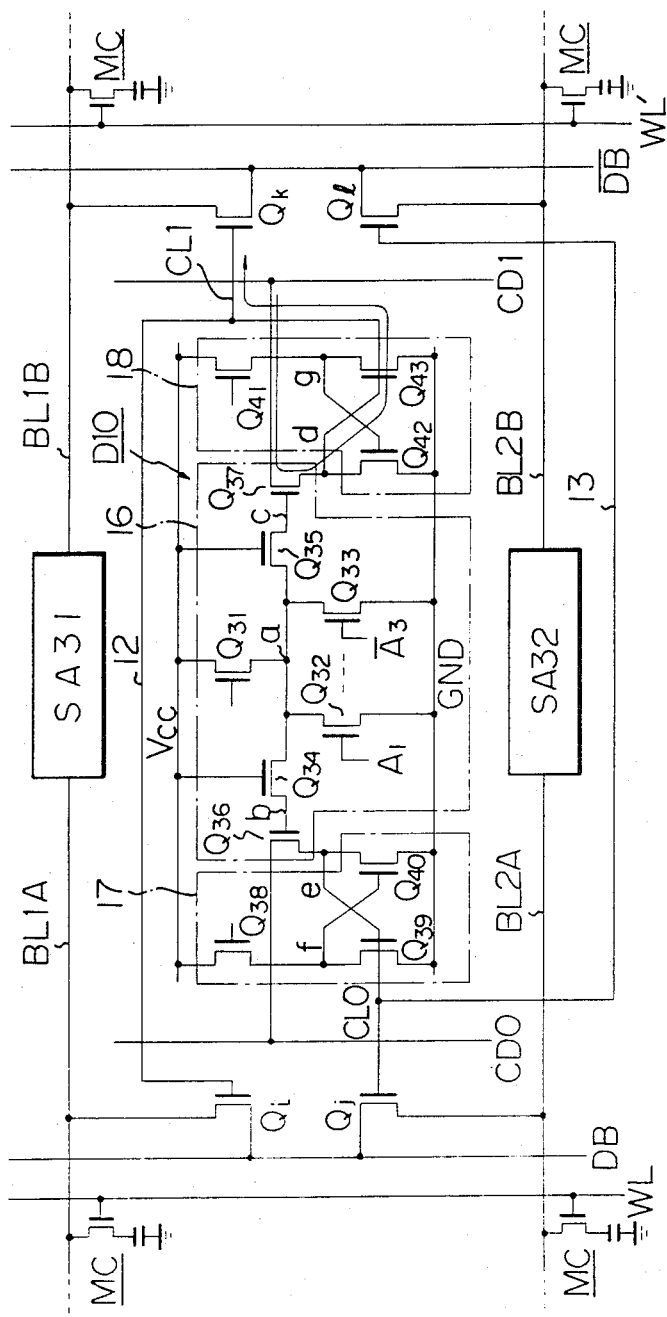
FIG. 4 is a partial block circuit diagram of a circuit for selecting a sense amplifier used in the semiconductor memory device of FIG. 3.

FIG. 4 is a detailed of the circuit structure which is schematically shown in FIG. 3. In FIG. 4, the same parts that appear in FIG. 3 are designated by the same reference symbols. Therefore, an explanation thereof is omitted here.

As illustrated in FIG. 4, the column decoder D10 comprises a decoding circuit or portion 16 and clamping circuits or portions 17 and 18. The decoding portion 16 comprises MIS transistors Q31 through Q37. Transistors Q30, Q31, - - -, Q32 comprise a NOR gate to which column address signals, for example, A1, - - -, A3, are applied. The clamping portion 17 comprises a MIS transistor Q38 and cross-coupled MIS transistors Q39 and Q40. The clamping portion 18 comprises a MIS transistor Q41 and cross-coupled MIS transistors Q42 and Q43. The column-selecting signal lines CD0 and CD1 are connected to the clamping portions 17 and 18 through the MIS transistors Q36 and Q37 of the decoding portion 16, respectively. These MIS transistors Q36 and Q37 are turned on and off by the output signal of the decoding portion 16 which is supplied to the transistors Q34 and Q35.

In order to select a sense amplifier SA1 or SA2 and to transfer signals on the bit line BL1A or BL2A and on the bit line BL1B or BL2B to the data buses DB and $\overline{DB}$, respectively, there are provided gate elements Qi, Qj, Qk, and Ql which comprise, for example, MIS transistors.

The output signal CL1 from the clamping portion 18, which is generated on the basis of the column-selecting signal CD1 and the output signal from the decoding portion 16, is transferred to the control gate of the gate element Qk disposed adjacent to the column-selecting signal line CD1 on the semiconductor substrate and is also transferred to the control gate of the gate element Qi on the opposite side of the gate element Qk, with respect to the column decoder D10, through the line 12 disposed between adjacent sense amplifiers SA31 and SA32.

The output signal CL0 from the clamping portion 17, which is generated on the basis of the column-selecting signal CD0 and the output signal from the decoding portion 16, is transferred to the control gate of the gate element Qj disposed adjacent to the column-selecting signal line CD0 on the semiconductor substrate and is also transferred to the control gate of the gate element Ql on the opposite side of the gate element Qj, with respect to the column decoder D10, through the line 13 disposed between the adjacent sense amplifiers SA32 and SA33.

Operation of the circuit according to the present invention having the above-mentioned structure will now be explained.

When the column address signals are supplied to the decoding portion 16 of the column decoder D10 so that the decoding portion 16 outputs a high level signal, i.e., when the column decoder D10 is selected, if the column-selecting signal CD1 generated on the basis of the address signal A0 is switched to a high level, the transistor Q43 is turned on and the potential of a node g of the clamping portion 18 becomes low so that the transistor Q42 is turned off. Thereby, the potential of the output line CL1 becomes high. Therefore, the sense amplifier SA31 is selected, i.e., the gate elements Qk and Qi are turned on. At this time, if operation of a selected word line and the sense amplifier SA31 is performed and the readout signals from a selected memory cell are generated on the bit lines BL1A and BL1B, the signal on the bit line BL1A is transferred to the data bus DB through the gate element Qi and the signal on the bit line BL1B is transferred to the data bus $\overline{DB}$ through the gate element Qk.

In the above-mentioned condition in which the output signal from the column decoder D10 is high, if the column-selecting signal CD0 is generated on the basis that the address signal A0 is high and the column-selecting signal CD1, which is complementary to the signal CD0 and which is generated on the basis that the address signal A0, is low, the transistor Q39 is turned on and the potential of a node f of the clamping portion 17 becomes low so that the transistor Q40 is turned off. Thereby, the potential of the output line CL0 becomes high. Therefore, the sense amplifier SA32 is selected, i.e., the gate elements Qj and Ql are turned on. At this time, if operation of a selected word line and the sense amplifier SA32 is performed and the readout signals from a selected memory cell are generated on the bit lines BL2A and BL2B, the signal on the bit line BL2A is transferred to the data bus DB through the gate element Qj and the signal on the bit line BL2B is transferred to the data bus $\overline{DB}$ through the gate element Ql.

As is apparent from the above explanation, the memory device of FIGS. 3 and 4 uses only two column-selecting lines CD0 and CD1, one of the lines being disposed on one side of the sense amplifiers and the other line being disposed on the other side of the sense amplifiers in order to control the gate elements Qi, Qj, Qk, and Ql, while in the conventional memory device of FIGS. 1 and 2, four column-selecting lines are necessary, two of the lines being disposed on one side of the sense amplifiers and two of the lines being disposed on the other side of the sense amplifiers. Therefore, the area occupied by the conducting patterns on a semiconductor substrate is decreased and the degree of integration of the memory device becomes large. Since the number of column-selecting lines is decreased in the memory device according to the present invention, the total length of the column-selecting lines becomes short and the stray capacitance thereof affecting the electric signals transferred therethrough is greatly decreased. Therefore, the circuits for driving the column-selecting lines can be simplified and compact.

In the above-mentioned embodiment in which one of the two sense amplifiers SA31 and SA32 is selected by one column decoder D10, the signal on the bit line BL1A or BL2A is transferred to the data bus DB and the signal on the bit line BL1B or BL2B is transferred to the data bus $\overline{DB}$ according to the signal on the column-selecting line CD0 or CD1. However, the present invention is not limited to such an embodiment and can be applied in various cases. For example, it is possible to select more than two sense amplifiers with a single decoder circuit and to readout or write-in data a plurality of bits at the same time. In this case, the number of gate elements which are connected between the data buses and bit lines and which are turned on and off by a single decoder circuit is rendered larger than that of the gate elements used in the embodiment of FIGS. 3 and 4.

It is also possible to divide the column decoders into two groups and to dispose one group on one side of the sense amplifiers and the other group on the other side of the sense amplifiers.

We claim:

1. A semiconductor memory device formed on a semiconductor substrate, operatively connected to receive first and second control signals, comprising:
   a plurality of bit line pairs;
   sense amplifiers arrayed on the semiconductor substrate, the array of said sense amplifiers having first and second sides, said sense amplifiers, respectively, operatively connected to said bit line pairs;
   first and second data buses respectively disposed on said first and second sides of the array of said sense amplifiers;
   first and second gate elements respectively disposed on said first and second sides of the array of said sense amplifiers and connected between a corresponding bit line of one of said bit line pairs and one of said first and second data buses;
   column decoders, each of said column decoders having first and second sides and being provided for a plurality of said sense amplifiers, for outputting decoded signals;
   first and second control signal lines, respectively disposed on said first and second sides of the array of said senser amplifiers, and operatively connected to receive the first and second control signals, respectively;
   first and second means, respectively disposed on said first and second sides of said column decoders, and operatively connected to receive the first and second control signals, respectively, and operatively connected to receive said decoded signals, for providing gate control signals to said first and second gate elements to control the transfer of signals to and from said first and second data buses and one of said bit line pairs, in dependence upon both said decoded signals and the first and second control signals; and
   first and second conducting lines, disposed between the array of said sense amplifiers, for transferring said gate control signals between said first and second sides of the array of said sense amplifiers, each of said first conducting lines being connected between corresponding ones of said first gate elements and corresponding ones of said second means, each of said second conducting lines being connected between corresponding ones of said second gate elements and corresponding ones of said first means.

2. A semiconductor memory device according to claim 1, wherein each of said of said column decoders is operatively connected to receive column address signals and comprises:
   a decoding circuit for decoding the column address signals; and
   wherein said first and second means comprise first and second clamping circuits, operatively connected to said decoding circuit and said first and second gate elements, respectively, for producing output decoded signals in accordance with the decoded column address signals.

3. A semiconductor memory device according to claim 2, wherein said decoding circuit comprises:
   a decoding gate, operatively connected to receive the column address signals, for producing the decoded column address signals; and
   transfer gates, operatively connected to said decoding gate, controlled in dependence upon the decoded column address signals from said decoding gate.

4. A semiconductor memory device according to claim 3, wherein the signals on said first and second control signal lines are transferred to said first and second clamping circuits through said transfer gates, and the output signals from said first and second clamping circuits are supplied to said first and second gate elements, said first and second gate elements being turned on and off in dependence upon the output decoded signals from said first and second clamping circuits.

5. A semiconductor memory device according to claim 3, wherein said decoding gate is a NOR gate comprising a plurality of inverter transistors having gate electrodes operatively connected to receive the column address signals and operatively connected in parallel with each other.

6. A semiconductor memory device according to claim 2, wherein each of said first and second clamping circuits comprises transistors which are cross coupled at their gates and drains.

7. A semiconductor memory device according to claim 1, wherein each of said column decoders selects one of two of said sense amplifiers under the control of the signals from said first and second control signal lines.

8. A semiconductor memory device according to claim 1, wherein each of said column decoders is divided into two circuit sections, said first circuit section disposed on and operatively connected to the first side of the array of said sense amplifiers, and said second circuit section disposed on and operatively connected to the second side of the array of said sense amplifiers.

9. A semiconductor memory device according to claim 1, wherein said column decoders are divided into two groups, said first group arranged on and operatively connected to the first side of the array of said sense amplifiers, and said second group arranged on and operatively connected to the second side of the array of said sense amplifiers.

* * * * *

UNITED STATES PATENT AND TRADEMARK OFFICE
CERTIFICATE OF CORRECTION

PATENT NO. : 4,546,457

DATED : OCTOBER 8, 1985

INVENTOR(S) : SHIGEKI NOZAKI ET AL.

It is certified that error appears in the above-identified patent and that said Letters Patent is hereby corrected as shown below:

FRONT PAGE [56] "Primary Examiner-Popek Joseph A." should be --Primary Examiner-Joseph A. Popek--;

[57] ABSTRACT,
line 4, "decode" should be --decoders--;
line 15, after "amplifiers" insert --,--.

Col. 1, line 65, after "signals" insert --for selecting the sense amplifiers--.

Col. 2, line 40, "A1, A1, A2, A2, A3, A3" should be --A1, $\overline{A1}$, A2, $\overline{A2}$, A3, $\overline{A3}$--;

line 43, "A0" (second occurrence) should be --$\overline{A0}$--;

line 49, "A3" should be --$\overline{A3}$--.

Col. 3, line 35, "A1, A1, A2, A2" should be --A1, $\overline{A1}$, A2, $\overline{A2}$--;

line 36, "A3, A3" should be --A3, $\overline{A3}$--;

line 38, "A0" (second occurrence) should be --$\overline{A0}$--;

line 41, "A0" (second occurrence) should be --$\overline{A0}$--;

line 42, "A3" should be --$\overline{A3}$--.

UNITED STATES PATENT AND TRADEMARK OFFICE
CERTIFICATE OF CORRECTION

PATENT NO. : 4,546,457
DATED : OCTOBER 8, 1985
INVENTOR(S) : SHIGEKI NOZAKI ET AL.

It is certified that error appears in the above-identified patent and that said Letters Patent is hereby corrected as shown below:

Col. 4, line 13, "of the circuit" should be --circuit of the--;

line 24, "A3" should be --$\overline{A3}$--.

Col. 5, line 3, "AO" should be --$\overline{AO}$--;
line 67, after "data" insert --having--.

Signed and Sealed this

Fourth Day of February 1986

[SEAL]

Attest:

DONALD J. QUIGG

Attesting Officer    Commissioner of Patents and Trademarks